(12) United States Patent
Nakamura

(10) Patent No.: US 11,450,623 B2
(45) Date of Patent: Sep. 20, 2022

(54) SEMICONDUCTOR DEVICE

(71) Applicant: FUJI ELECTRIC CO., LTD., Kawasaki (JP)

(72) Inventor: Hideyo Nakamura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/331,031

(22) Filed: May 26, 2021

(65) Prior Publication Data

US 2022/0020703 A1   Jan. 20, 2022

(30) Foreign Application Priority Data

Jul. 17, 2020 (JP) .............................. JP2020-122569

(51) Int. Cl.
*H01L 23/00* (2006.01)
*H01L 23/31* (2006.01)
(Continued)

(52) U.S. Cl.
CPC ........ *H01L 23/562* (2013.01); *H01L 23/3121* (2013.01); *H01L 23/3735* (2013.01);
(Continued)

(58) Field of Classification Search
CPC ............... H01L 23/562; H01L 23/3121; H01L 23/3735; H01L 24/16; H01L 25/072; H01L 2224/16225; H01L 2924/10253; H01L 2924/10272; H01L 2924/1033; H01L 2924/1067; H01L 2924/1302; H01L 2924/13032; H01L 2924/13055; H01L 2924/13091; H01L 2924/15787; H01L 2924/3512; H01L 2224/32225;
(Continued)

(56) References Cited

U.S. PATENT DOCUMENTS

| | | |
|---|---|---|
| 2001/0011757 A1 | 8/2001 | Miyake et al. |
| 2015/0223339 A1 | 8/2015 | Nakamura et al. |

FOREIGN PATENT DOCUMENTS

| | | |
|---|---|---|
| JP | 1122146 A | 5/1989 |
| JP | 6349845 A | 12/1994 |

(Continued)

OTHER PUBLICATIONS

Nashida et al.; "All-SiC Module Technologies", Fuji Electric Review, 2012, vol. 85, No. 6, p. 403-407.

*Primary Examiner* — Elias Ullah

(57) ABSTRACT

A semiconductor device includes: a plurality of semiconductor chips each including a first main electrode on a top surfaces and including a second main electrode and a control electrode on a bottom surface; a first common main electrode connected to the first main electrodes; a printed board including a control wiring part and a main wiring part provided on a bottom surface of an insulating layer, and a common control electrode and a second common main electrode provided on a top surface of the insulating layer and electrically connected to the control wiring part and the main wiring part; projection electrodes bonding the control electrodes to the control wiring part; projection electrodes bonding the second main electrodes to the main wiring part; and a sealing member sealing the semiconductor chips and exposing the first common main electrode, the common control electrode, and the second common main electrode.

11 Claims, 11 Drawing Sheets

(51) Int. Cl.
*H01L 23/373* (2006.01)
*H01L 25/07* (2006.01)

(52) U.S. Cl.
CPC ............ *H01L 24/16* (2013.01); *H01L 25/072* (2013.01); *H01L 2224/16225* (2013.01); *H01L 2924/1033* (2013.01); *H01L 2924/1067* (2013.01); *H01L 2924/10253* (2013.01); *H01L 2924/10272* (2013.01); *H01L 2924/1302* (2013.01); *H01L 2924/13032* (2013.01); *H01L 2924/13055* (2013.01); *H01L 2924/13091* (2013.01); *H01L 2924/15787* (2013.01); *H01L 2924/3512* (2013.01)

(58) Field of Classification Search
CPC . H01L 2224/32245; H01L 2224/33181; H01L 2224/40; H01L 2224/48091; H01L 2224/73253; H01L 2224/73265; H01L 2224/83385; H01L 2924/181; H01L 23/24; H01L 23/3142; H01L 23/36; H01L 23/492; H01L 23/5386
See application file for complete search history.

(56) References Cited

FOREIGN PATENT DOCUMENTS

| | | | |
|---|---|---|---|
| JP | 2001298152 | A | 10/2001 |
| JP | 2005223223 | A | 8/2005 |
| JP | 2012191010 | A | 10/2012 |
| WO | 2014061211 | A1 | 4/2014 |

SEMICONDUCTOR DEVICE

CROSS-REFERENCE TO RELATED APPLICATION

This application claims benefit of priority under 35 USC 119 based on Japanese Patent Application No. 2020-122569 filed on Jul. 17, 2020, the entire contents of which are incorporated by reference herein.

BACKGROUND

1. Field of the Invention

The present invention relates to a semiconductor device (a semiconductor module) on which power semiconductor elements and the like are mounted.

2. Description of the Related Art

Typical semiconductor modules are provided with semiconductor chips mounted on one surface of a ceramic insulating substrate to be wired inside by wire bonding, ribbon bonding, or lead frame connection (refer to FIG. 15 in WO 2014/061211). The ceramic insulating substrate is mounted on a metal base having a heat-diffusing function and is covered with a case mainly made of resin and filled with gel, so as to improve the insulating property. While FIG. 15 in WO 2014/061211 schematically illustrates the single semiconductor chip, the semiconductor module may include a plurality of semiconductor chips mounted to be arranged in parallel to each other. FIG. 15 in WO 2014/061211 also illustrates the single circuit, but the semiconductor module may have a 2-in-1 configuration including semiconductor elements for two circuits or a 6-in-1 configuration including semiconductor elements for six circuits.

A wide band-gap semiconductor, such as silicon carbide (SiC), gallium nitride (GaN), or gallium oxide ($Ga_2O_3$), used for the semiconductor chips mounted on the semiconductor device illustrated in FIG. 15 in WO 2014/061211 has the characteristics such as high-speed performance, a small loss, and high heat resistance, as compared with silicon (Si). The wide band-gap semiconductor is typically small since a chip having a larger size leads to a reduction in yield to increase costs because of a large number of crystal defects. The wide band-gap semiconductor thus hardly employs ribbon bonding or lead frame connection or even thick wire bonding, and inevitably needs to use connecting pads having a small size and thin wires that are insufficient to deal with a current (a rated current) to be switched.

A size of a chip using a wide band-gap semiconductor is sometimes increased to ensure a space for a pad so as to use ribbon bonding or lead frame connection while taking no account of the manufacturing costs. The use of the chip with a larger size to increase a contact area and execute a power cycle or a heat cycle in a wide temperature range while making use of the high heat resistance, however, increases a difference in thermal expansion between the chip and a wiring material to easily cause cracks at a chip electrode part or a connected part such as a soldering part. The chip having a larger size thus still does not have the tolerance to the use in a wider temperature range than Si, such as at a high temperature, which cannot make the best use of the original properties of the chip accordingly. To deal with this, a case is known in which a large number of chips having a small size as disclosed in WO 2014/061211 are integrated together, and fine pins are connected to pads for the semiconductor chips.

WO 2014/061211 discloses the semiconductor device including a plurality of conductive pattern members on which the plural power semiconductor chips are mounted, and a printed board provided with a plurality of rod-shaped conductive connection members connected to the power semiconductor chips and the conductive pattern members and deposited on the surface opposed to the conductive pattern members. JP 2012-191010 discloses a semiconductor device including an insulating substrate, a metal block fixed to the insulating substrate, a plurality of semiconductor elements using a wide band-gap semiconductor and fixed to the metal block, a plurality of implanted pins fixed to the semiconductor elements, a printed board fixed to the implanted pins and arranged to be opposed to the semiconductor elements, and a sealing material arranged between the semiconductor elements and the printed board.

JP 2001-298152 discloses a pressure contact-type semiconductor device including a first common main power source plate electrically connected to first main electrodes of a plurality of semiconductor elements, and a second common main power supply plate electrically connected to second main electrodes, in which the plural semiconductor elements are held in a pressure-contact state between the first common main power supply plate and the second common main power supply plate. JP H06-349845 discloses a semiconductor integrated circuit including a plurality of semiconductor elements connected in parallel, an output electrode connector in which a plurality of output electrodes of the semiconductor elements are connected to each other, and a common electrode connector in which a plurality of common electrodes of the semiconductor elements are connected to each other.

JP H01-122146 discloses a flat-shaped semiconductor device including first and second main circuit electrodes, and first and second electrode conductors respectively connected to the first and second main circuit electrodes, the semiconductor device having a configuration in which a plurality of semiconductor elements are combined together. JP 2005-223223 discloses a semiconductor IC-mounted substrate in which stud bumps are provided on a semiconductor IC buried in a second resin layer on a ground layer, and the stud bumps are connected to a wiring layer at an upper part of the second resin layer. NASHIDA Norihiro et al.; "All-SiC Module Technologies", Fuji Electric Review, 2012, Vol. 85, No. 6, p. 403-407 disclose semiconductor modules equipped with power semiconductor chips.

The configuration illustrated in FIG. 15 in WO 2014/061211 has been obtained on the semiconductor module manufacturer's side such that the semiconductor chips are combined to have necessary capacity and circuit structure to be connected by the wire bonding and the like, and the terminals are led out of the package, so that the user does not need to manage the fine semiconductor chips themselves but only needs to mechanically attach wires such as busbars to the terminals of the package. The semiconductor device as illustrated in FIG. 15 in WO 2014/061211 is, however, manufactured for various purposes, and has a great volume with respect to the size of the semiconductor chips themselves, which increases the length of the internal wires accordingly.

A demand for a reduction in length of wires has grown in order to achieve a reduction in inductance to deal with recent wide band-gap semiconductors and high-speed switching performance for making use of the characteristics of the wide band-gap semiconductors. In addition, a demand for a reduction in size of devices such as an inverter has grown in association with the popularization of electric vehicles. The fabrication of wide band-gap semiconductor modules thus has been increased, instead of multi-purpose semiconductor modules. Further, integrating semiconductor chips themselves with a general electronic circuit component such as a capacitor and further a cooling fin to package together with a high density on the users' side has become popular, so as to achieve a decrease in length of the wires and a reduction in size of the entire device.

As described above, however, the semiconductor chip having a small size using the wide band-gap semiconductor needs to use a small connection pad, which impedes free wiring for users who fabricate dedicated modules using typical Si chips or normal users who assemble electronic components.

SUMMARY

In view of the foregoing problems, the present invention provides a semiconductor device capable of enhancing integration performance equivalent to a case of combining semiconductor chips themselves, and also enabling a chip size package (CSP) that is easy to handle.

An aspect of the present invention inheres in a semiconductor device including: a plurality of semiconductor chips each including a first main electrode on one of main surfaces and including a second main electrode and a control electrode on another main surface; a first common main electrode with one of main surfaces connected to the respective first main electrodes of the semiconductor chips; and a printed board including an insulating layer with one of main surfaces separately opposed to the other main surface of the respective semiconductor chips, a control wiring part provided on the one main surface of the insulating layer to be electrically connected to the respective control electrodes, a main wiring part provided on the one main surface of the insulating layer and arranged adjacent to the control wiring part to be electrically connected to the respective second main electrodes, a common control electrode provided on another main surface of the insulating layer and located at a position at least partly overlapping with the control wiring part via the insulating layer in a plan view, a second common main electrode provided on the other main surface of the insulating layer and located at a position at least partly overlapping with the control wiring part and the main wiring part via the insulating layer in the plan view, a first metal layer provided on an inner wall of a first penetration hole penetrating the control wiring part, the insulating layer, and the common control electrode to electrically connect the control wiring part and the common control electrode via the first penetration hole, and a second metal layer provided on an inner wall of a second penetration hole penetrating the main wiring part, the insulating layer, and the second common main electrode to electrically connect the main wiring part and the second common main electrode via the second penetration hole.

DETAILED DESCRIPTION

Figure 1:
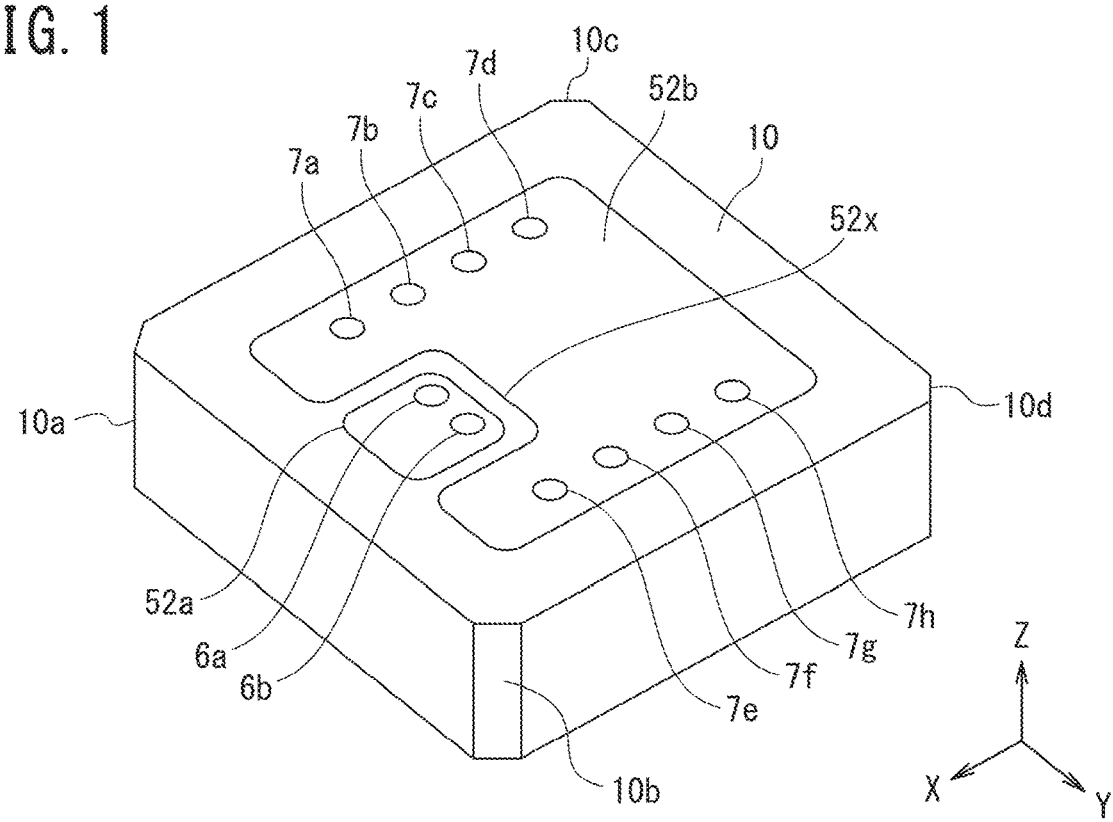
FIG. 1 is a perspective view of a semiconductor device according to an embodiment of the present invention.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the Specification, a "first main electrode" of a semiconductor chip (semiconductor element) means an electrode which supplies a main current for the semiconductor chip or receives the main current from the semiconductor chip. The first main electrode is assigned to an electrode which will be a source electrode or a drain electrode in a field-effect transistor (FET) or a static induction transistor (SIT), an emitter electrode or a collector electrode in an insulated-gate bipolar transistor (IGBT) and an anode electrode or a cathode electrode in a static induction (SI) thyristor or a gate turn-off (GTO) thyristor.

A "second main electrode" of the semiconductor chip is assigned to an electrode which will not be the first main electrode and will be the source electrode or the drain electrode in the FET or the SIT, the emitter electrode or the collector electrode in the IGBT, and the anode electrode or the cathode electrode in the SI thyristor or the GTO thyristor. That is, when the first main electrode is the source electrode, the second main electrode means the drain electrode. When the first main electrode is the emitter electrode, the second main electrode means the collector electrode. When the first main electrode is the anode electrode, the second main electrode means the cathode electrode. A function of the first main electrode and a function of the second main electrode are exchangeable each other by exchanging a bias relationship if the structure of the subject semiconductor chip is symmetric such as MISFET.

<Configuration of Semiconductor Device>

Figure 2:
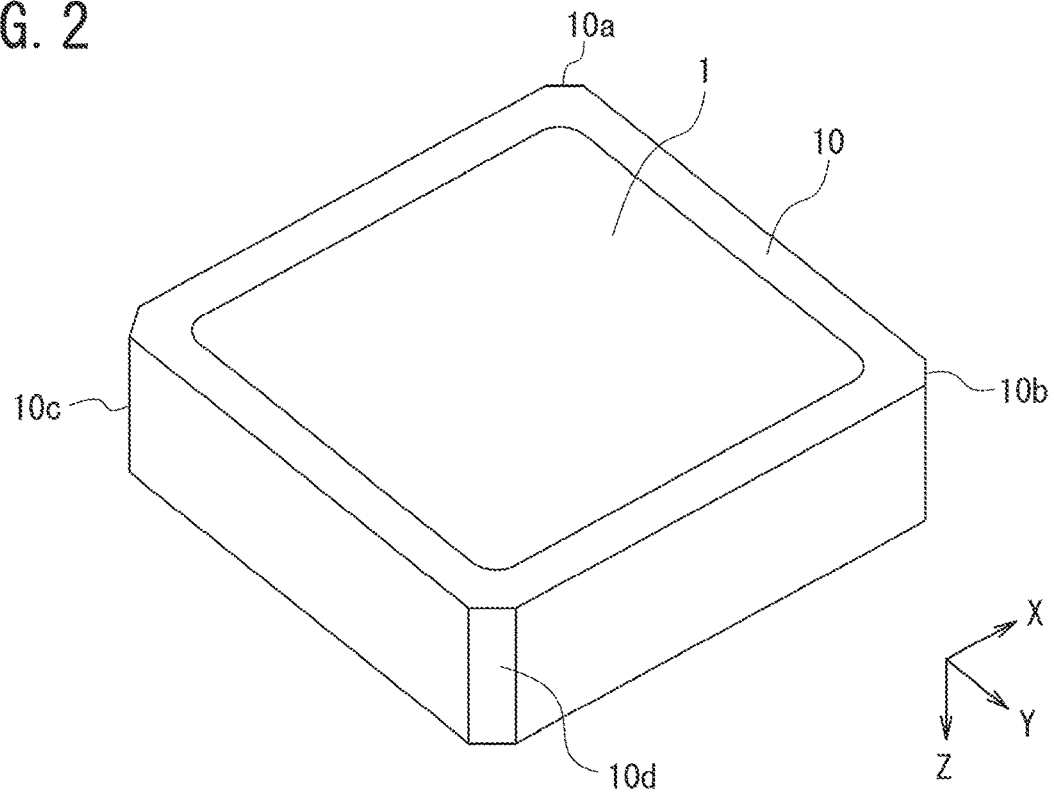
FIG. 2 is a perspective view of the semiconductor device according to the embodiment of the present invention as viewed from a position different from FIG. 1.

A semiconductor device (a semiconductor module) according to an embodiment of the present invention has a substantially cuboidal shape as an external appearance, as illustrated in FIG. 1 and FIG. 2. The semiconductor device according to the embodiment of the present invention is entirely covered with a sealing member 10. As illustrated in FIG. 2, a first common main electrode 1 is exposed on the sealing member 10 on one surface of the substantially cuboidal shape of the semiconductor device according to the embodiment of the present invention.

As illustrated in FIG. 1, a common control electrode 52a and a second common main electrode 52b are exposed on the sealing member 10 on the opposite surface on which the first common main electrode 1 is exposed. The common control electrode 52a is provided with first penetration holes (through holes or vias) 6a and 6b. The second common main electrode 52b is provided with second penetration holes (through holes or vias) 7a, 7b, 7c, 7d, 7e, 7f, 7g, and 7h. The first penetration holes 6a and 6b and the second penetration holes 7a to 7h are filled with the sealing member 10.

As illustrated in FIG. 1 and FIG. 2, in the substantially cuboidal shape of the semiconductor device according to the embodiment of the present invention, a normal direction of the surface on which the first common main electrode 1 is exposed and the surface on which the common control electrode 52a and the second common main electrode 52b are exposed is defined as a Z-axis direction, a normal direction of a surface of one of the side walls of the sealing member 10 closest to the common control electrode 52a and perpendicular to the Z-axis direction is defined as an X-axis direction, and a direction perpendicular to the X-axis direction and the Z-axis direction is defined as a Y-axis direction.

As illustrated in FIG. 1 and FIG. 2, the respective corners of the sealing member 10 defining the substantially cuboidal shape of the semiconductor device according to the embodiment of the present invention are rounded off to define round-off parts 10a, 10b, 10c, and 10d. The sealing member 10 is not necessarily provided with the round-off parts 10a to 10d. The other corners of the sealing member 10 may also be rounded off.

Figure 3:
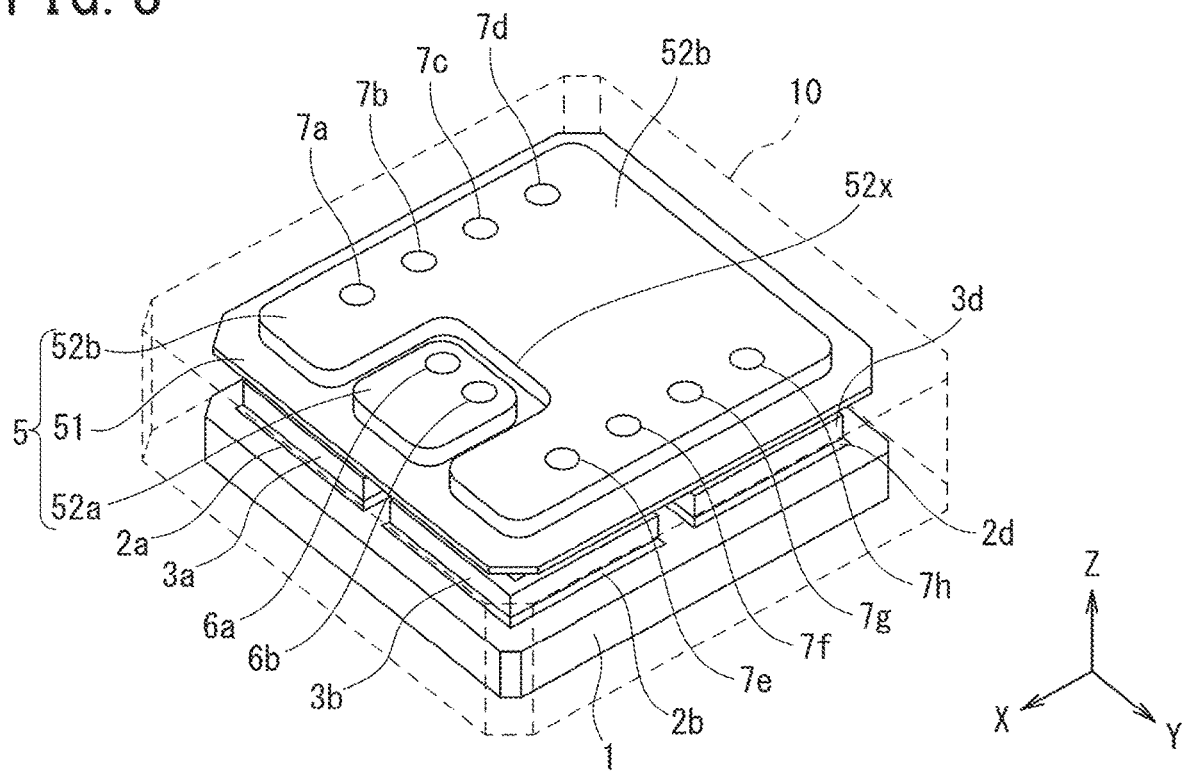
FIG. 3 is a perspective view illustrating an internal structure of the semiconductor device according to the embodiment of the present invention.
Figure 4:
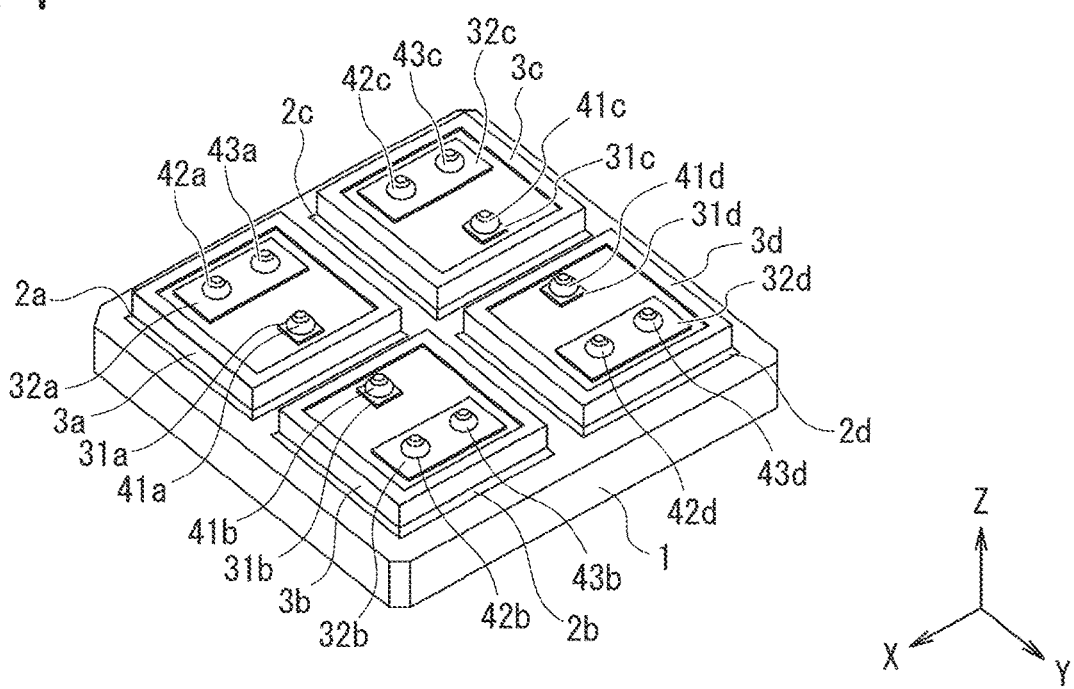
FIG. 4 is a perspective view partly illustrating the internal structure of the semiconductor device according to the embodiment of the present invention.
Figure 5:
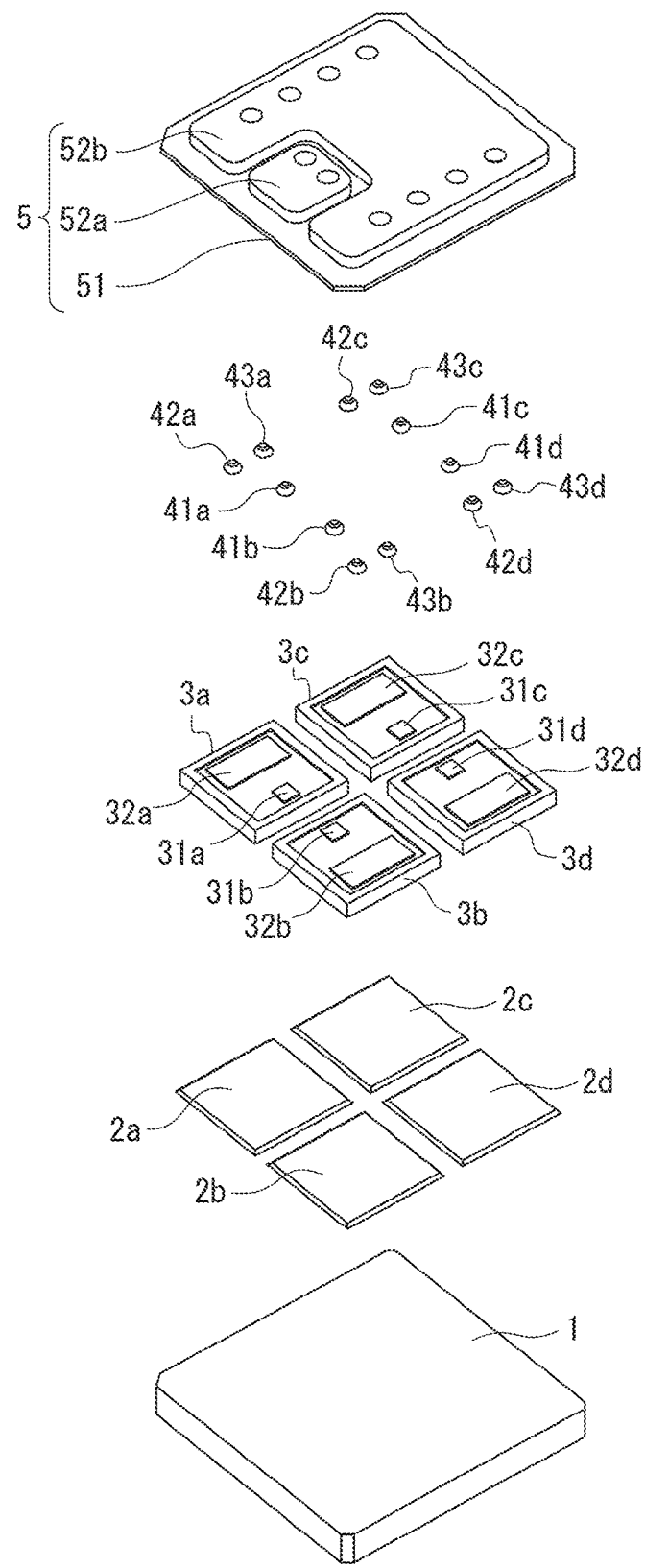
FIG. 5 is an exploded perspective view of the internal structure of the semiconductor device according to the embodiment of the present invention.
Figure 6:
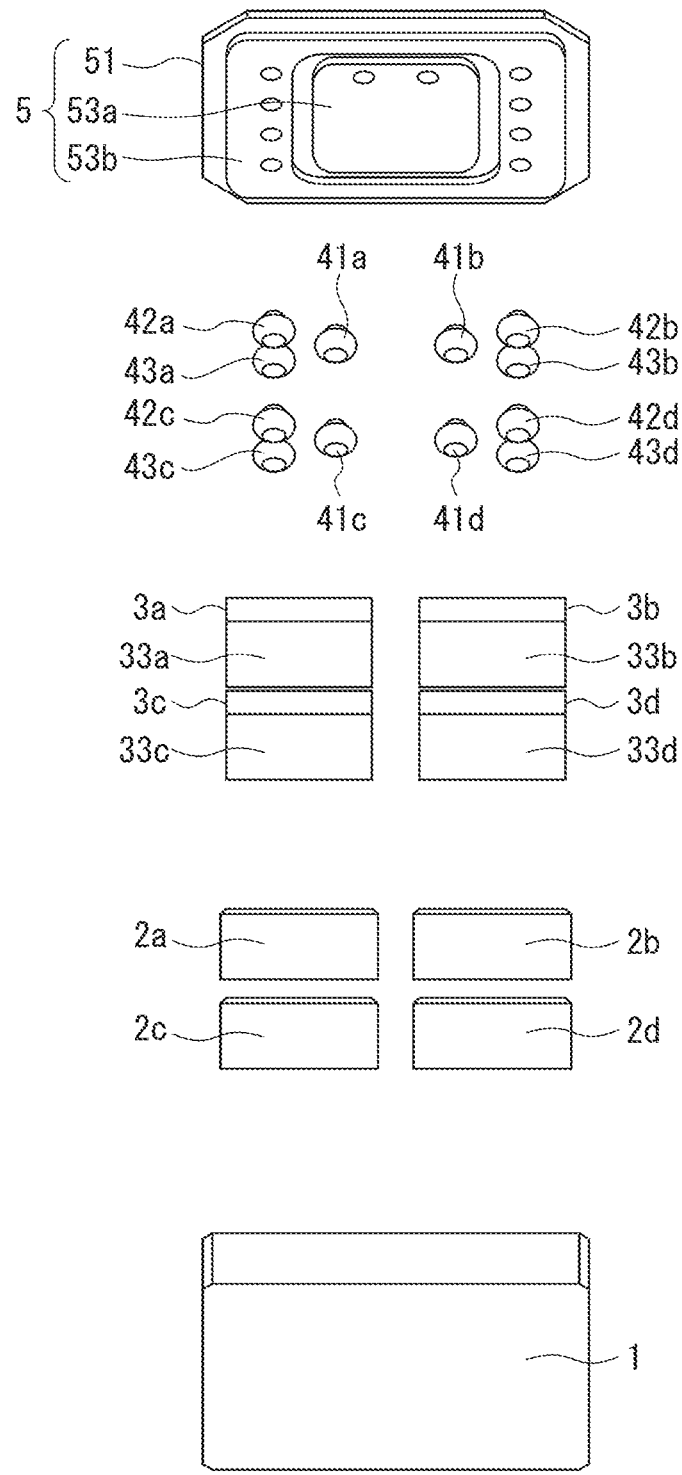
FIG. 6 is an exploded perspective view of the internal structure of the semiconductor device according to the embodiment of the present invention as viewed from a position different from FIG. 5.
Figure 7:
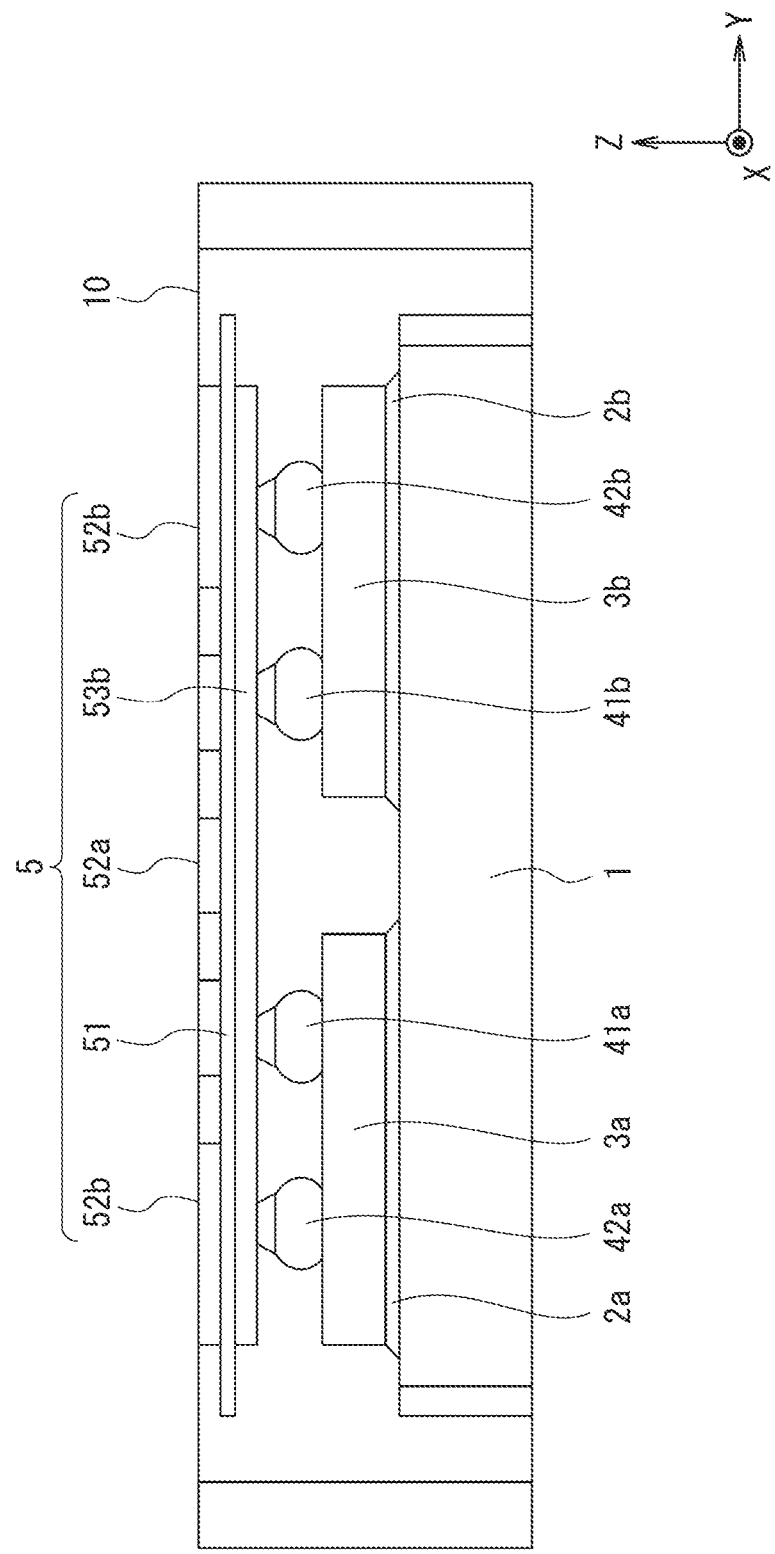
FIG. 7 is a side view of the semiconductor device according to the embodiment of the present invention.

FIG. 3 is a perspective view illustrating an internal structure of the semiconductor device according to the embodiment of the present invention illustrated in FIG. 1 while omitting the illustration of the sealing member 10 and indicating the outline of the sealing member 10 by the broken line. FIG. 4 is a perspective view illustrating the internal structure of the semiconductor device according to the embodiment of the present invention illustrated in FIG. 3 further omitting the illustration of the printed board 5. FIG. 5 is an exploded perspective view of the internal structure of the semiconductor device according to the embodiment of the present invention illustrated in FIG. 3 as viewed from the printed board 5 side. FIG. 6 is an exploded perspective view of the internal structure of the semiconductor device according to the embodiment of the present invention illustrated in FIG. 3 as viewed from the first common main electrode 1 side. FIG. 7 is a side view of the semiconductor device according to the embodiment of the present invention as viewed from the side on which semiconductor chips 3a and 3b are located.

As illustrated in FIG. 3 to FIG. 7, the semiconductor device according to the embodiment of the present invention includes the first common main electrode 1, and a plurality of semiconductor chips 3a, 3b, 3c, and 3d mounted on one of the main surfaces (an element-mounted surface) of the first common main electrode 1 via a plurality of bonding members 2a, 2b, 2c, and 2d.

The first common main electrode 1 is made of a plate-shaped conductive member. The first common main electrode 1 as used herein may be a metallic plate made of copper (Cu), for example. As illustrated in FIG. 2, the other main surface (a non-element-mounted surface) of the first common main electrode 1 is exposed on the sealing member 10 to serve as an electrode pad.

The bonding members 2a to 2d as used herein may each be a solder such as a high-temperature solder, or a sintered metal body such as nanosilver (Ag) paste, for example. The respective semiconductor chips 3a, 3b, 3c, and 3d and the first common main electrode 1 may be bonded together by plating or diffusion bonding (solid phase bonding), for example. The fusing point at the bonded part between the respective semiconductor chips 3a, 3b, 3c, and 3d and the first common main electrode 1 is preferably about 300° C. or greater.

The semiconductor chips 3a to 3d as used herein may each be an IGBT, a FET, a SI thyristor, or a GTO thyristor, for example. The present embodiment is illustrated below with the case in which the semiconductor chips 3a to 3d are each a FET. The semiconductor chips 3a to 3d may each be made of a substrate of a wide band-gap semiconductor such as silicon carbide (SiC), gallium nitride (GaN), and gallium oxide ($Ga_2O_3$), or made of a silicon (Si) substrate.

The semiconductor chips 3a to 3d are provided with first main electrodes (drain electrodes) 33a, 33b, 33c, and 33d on one of the main surfaces (a non-element surface). The first main electrodes 33a to 33d are bonded to one of the main surfaces (the element-mounted surface) of the first common main electrode 1 via the respective bonding members 2a to 2d. The first common main electrode 1 serves as an electrode pad common to the first main electrodes 33a to 33d of the semiconductor chips 3a to 3d.

The semiconductor chips 3a to 3d are also provided with control electrodes (gate electrodes) 31a, 31b, 31c, and 31d and second main electrodes (source electrodes) 32a, 32b, 32c, and 32c on the other main surface (an element surface) opposite to the one main surface (the non-element surface). A main current flows between the respective second main electrodes 32a to 32d and the respective first main electrodes 33a to 33d in the respective semiconductor chips 3a to 3d. The control electrodes 31a to 31d control the main current flowing between the respective second main electrodes 32a to 32d and the respective first main electrodes 33a to 33d in accordance with a predetermined control signal applied to the respective control electrodes 31a to 31d.

Figure 8:
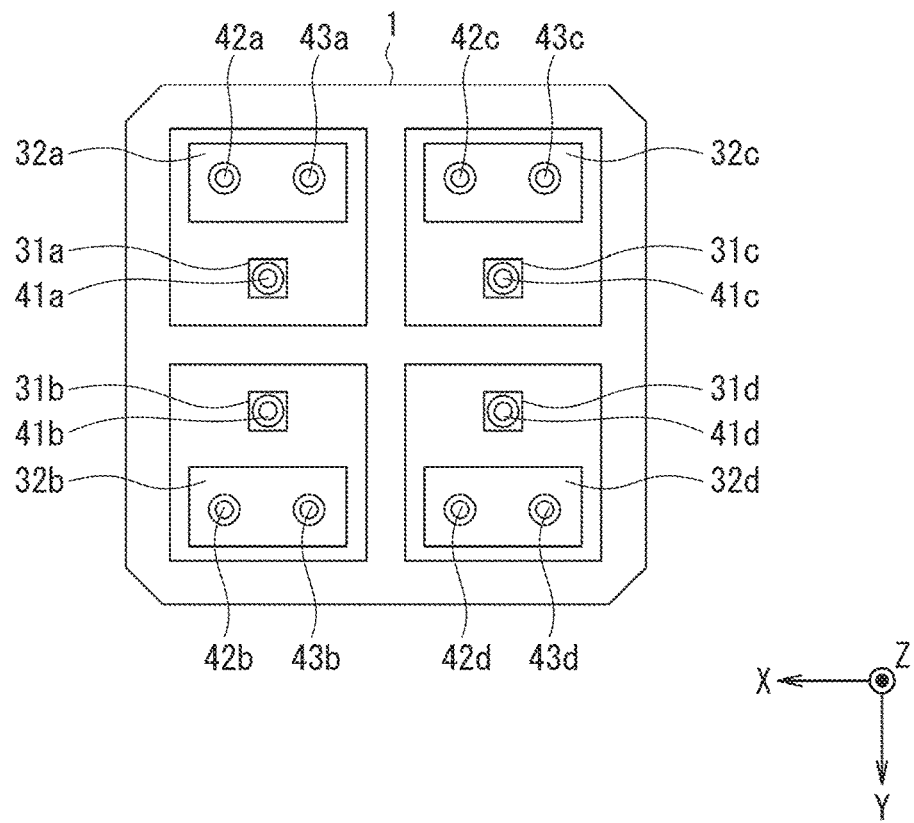
FIG. 8 is a plan view of a first common main electrode and semiconductor chips of the semiconductor device according to the embodiment of the present invention.

As illustrated in FIG. 4, FIG. 7, and FIG. 8, the semiconductor chips 3a to 3d are arranged such that the control electrodes 31a to 31d of the semiconductor chips 3a to 3d are opposed and adjacent to each other. The semiconductor chips 3a and 3b are arranged adjacent to each other in the opposite direction so that the control electrodes 31a and 31b of the semiconductor chips 3a and 3b are opposed and adjacent to each other in the Y-axis direction. Similarly, the semiconductor chips 3c and 3d are arranged adjacent to each other in the opposite direction so that the control electrodes 31c and 31d of the semiconductor chips 3c and 3d are opposed and adjacent to each other in the Y-axis direction.

The semiconductor chips 3a and 3c are arranged adjacent to each other in the same direction so that the respective control electrodes 31a and 31c and the respective second main electrodes 32a and 32c of the semiconductor chips 3a and 3c are opposed and adjacent to each other in the X-axis direction. Similarly, the semiconductor chips 3b and 3d are arranged adjacent to each other in the same direction so that the respective control electrodes 31b and 31d and the respective second main electrodes 32b and 32d of the semiconductor chips 3b and 3d are opposed and adjacent to each other in the X-axis direction. The semiconductor chips 3a to 3d have a size of about one millimeters square or greater and five millimeters square or smaller, for example, but the size is not limited to this range. A gap between the respective semiconductor chips 3a to 3d is set to about one millimeter or greater and two millimeters or smaller, for example, but the gap is not limited to this range.

The arrangement positions of the semiconductor chips 3a to 3d are not limited to those as illustrated in FIG. 4, FIG. 7, or FIG. 8. For example, the second main electrodes 32a to 32d of the semiconductor chips 3a to 3d may be arranged so as to be opposed and adjacent to each other in the direction opposite to the case of the semiconductor chips 3a to 3d illustrated in FIG. 4, FIG. 7, and FIG. 8. While FIG. 4, FIG. 7, and FIG. 8 each illustrate the case of including the four semiconductor chips 3a to 3d, the number of the semiconductor chips is not limited to this case. The semiconductor device may include a single semiconductor chip, two or three semiconductor chips, or five or more semiconductor chips, for example.

As illustrated in FIG. 3 and FIG. 5 to FIG. 7, the printed board 5 is arranged to be separately opposed to the other main surface (the element surface) of the respective semiconductor chips 3a to 3d. The printed board 5 includes an insulating layer 51, a control wiring part 53a and a main wiring part 53b arranged on one of the main surfaces (an element-opposed surface) of the insulating layer 51, and the common control electrode 52a and the second common main electrode 52b arranged on the other main surface (a non-element-opposed surface) of the insulating layer 51. The insulating layer 51 is arranged such that the one main surface of the insulating layer 51 is separately opposed to the other main surface of the respective semiconductor chips 3a to 3d. The control wiring part 53a is electrically connected to the control electrodes 31a to 31d of the respective semiconductor chips 3a to 3d. The main wiring part 53b is arranged adjacent to the control wiring part 53a and electrically connected to the second main electrodes 32a to 32d of the respective semiconductor chips 3a to 3d. The common control electrode 52a is arranged at a position at least partly overlapping with the control wiring part 53a via the insulating layer 51 in a plan view. The second common main electrode 52b is arranged at a position at least partly overlapping with the control wiring part 53a and the main wiring part 53b via the insulating layer 51 in a plan view.

The other main surface (the element surface) of the respective semiconductor chips 3a to 3d is bonded to one of the main surfaces (the element-opposed surface) of the printed board 5 via a plurality of projection electrodes 41a, 41b, 41c, 41d, 42a, 42b, 42c, 42d, 43a, 43b, 43c, and 43d.

The projection electrodes 41a to 41d, 42a to 42d, and 43a to 43d as used herein are each a stud bump made of gold (Au), for example. The projection electrodes 41a to 41d, 42a to 42d, and 43a to 43d as used herein may each be a solder, a sintered metal body such as nanosilver (Ag) paste, or a pillar electrode or a boll-shaped electrode made of various kinds of metallic material, instead of the stud bump. A height of the projection electrodes 41a to 41d, 42a to 42d, and 43a to 43d is about 40 micrometers or greater and 350 micrometers or less, and a diameter is about 30 micrometers or greater and 350 micrometers or less, for example. The height and the diameter may be determined as appropriate depending on the size of the respective semiconductor chips 3a to 3d, for example. The number of the projection electrodes is not limited to the case illustrated in FIG. 4 or FIG. 5. The number of the projection electrodes may be determined as appropriate depending on the current and the pad size, for example.

The control electrode 31a of the semiconductor chip 3a is bonded to the control wiring part 53a of the printed board 5 via the projection electrode 41a. The second main electrode 32a of the semiconductor chip 3a is bonded to the main wiring part 53b of the printed board 5 via the two projection electrodes 42a and 43a.

The control electrode 31b of the semiconductor chip 3b is bonded to the control wiring part 53a of the printed board 5 via the projection electrode 41b. The second main electrode 32b of the semiconductor chip 3b is bonded to the main wiring part 53b of the printed board 5 via the two projection electrodes 42b and 43b.

The control electrode 31c of the semiconductor chip 3c is bonded to the control wiring part 53a of the printed board 5 via the projection electrode 41c. The second main electrode 32c of the semiconductor chip 3c is bonded to the main wiring part 53b of the printed board 5 via the two projection electrodes 42c and 43c.

The control electrode 31d of the semiconductor chip 3d is bonded to the control wiring part 53a of the printed board 5 via the projection electrode 41d. The second main electrode 32d of the semiconductor chip 3d is bonded to the main wiring part 53b of the printed board 5 via the two projection electrodes 42d and 43d.

The number of the projection electrodes interposed to bond the respective control electrodes 31a to 31d of the semiconductor chips 3a to 3d and the control wiring part 53a of the printed board 5 to each other may be determined as appropriate. The number of the projection electrodes interposed to bond the respective control electrodes 32a to 32d of the semiconductor chips 3a to 3d and the main wiring part 53b of the printed board 5 to each other may be determined as appropriate.

The insulating layer 51 of the printed board 5 illustrated in FIG. 3 and FIG. 5 to FIG. 7 is made of insulating material such as ceramic mainly containing alumina ($Al_2O_3$), aluminum nitride (AlN), or silicon nitride ($Si_3O_4$), or resin, for example. The insulating layer 51 may be a resin substrate made of a combination of glass fiber and epoxy resin, for example.

The control wiring part 53a, the main wiring part 53b, the common control electrode 52a, and the second common main electrode 52b are each made of a copper foil, for example. The control wiring part 53a, the main wiring part 53b, the common control electrode 52a, and the second common main electrode 52b may each be a combination of a copper (Cu) plate and an aluminum (Al) plate, or a member plated with copper, nickel (Ni), or tin (Sn), for example.

Figure 9:
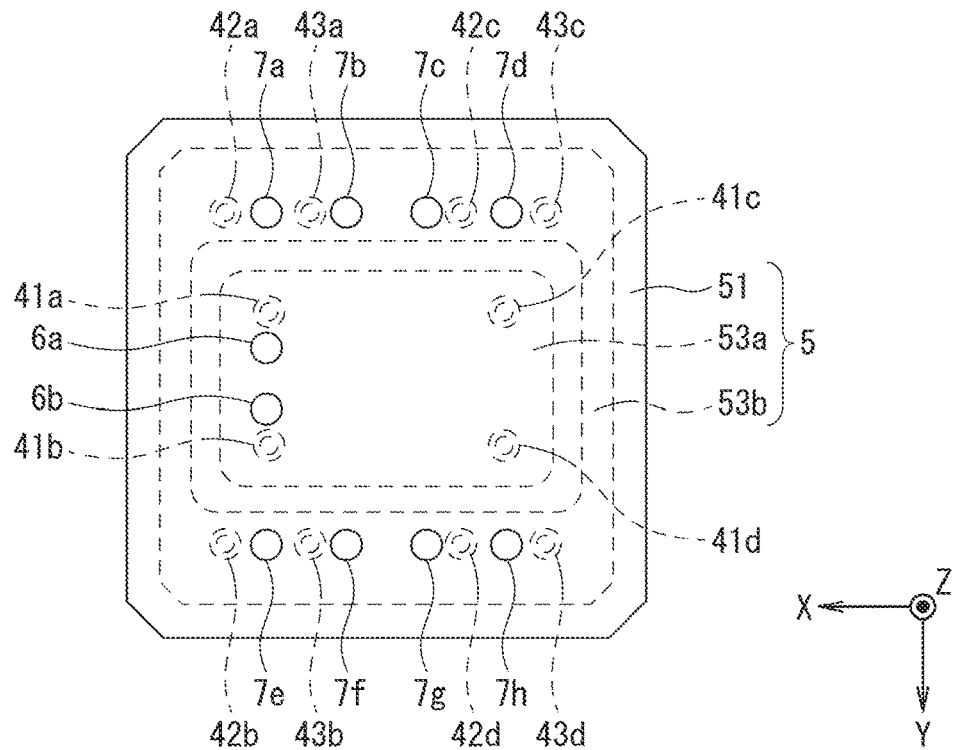
FIG. 9 is a plan view of an insulating layer of a printed board of the semiconductor device according to the embodiment of the present invention.

FIG. 9 is a plan view illustrating the insulating layer 51 as viewed from the other main surface (the non-element-opposed surface) of the printed board 5, while omitting the illustration of the common control electrode 52a and the second common main electrode 52b on the other main surface (the non-element-opposed surface) side. FIG. 9 schematically indicates by the broken lines the control wiring part 53a and the main wiring part 53b on the one main surface (the element-opposed surface) of the insulating layer 51. FIG. 9 also schematically indicates by the broken lines the projection electrodes 41a to 41d, 42a to 42d, and 43a to 43d bonded to the control wiring part 53a and the main wiring part 53b.

As illustrated in FIG. 9, the control wiring part 53a and the main wiring part 53b are separated from each other. The control wiring part 53a has a substantially rectangular planar pattern. The main wiring part 53b has a ring-shaped planar pattern surrounding the circumference of the control wiring part 53a. The respective planar patterns of the control wiring part 53a and the main wiring part 53b are not limited to the case illustrated in the drawings, and may be determined as appropriate depending on the arrangement positions of the semiconductor chips 3a to 3d. For example, the main wiring part 53b may have a U-shaped planar pattern.

Figure 10:
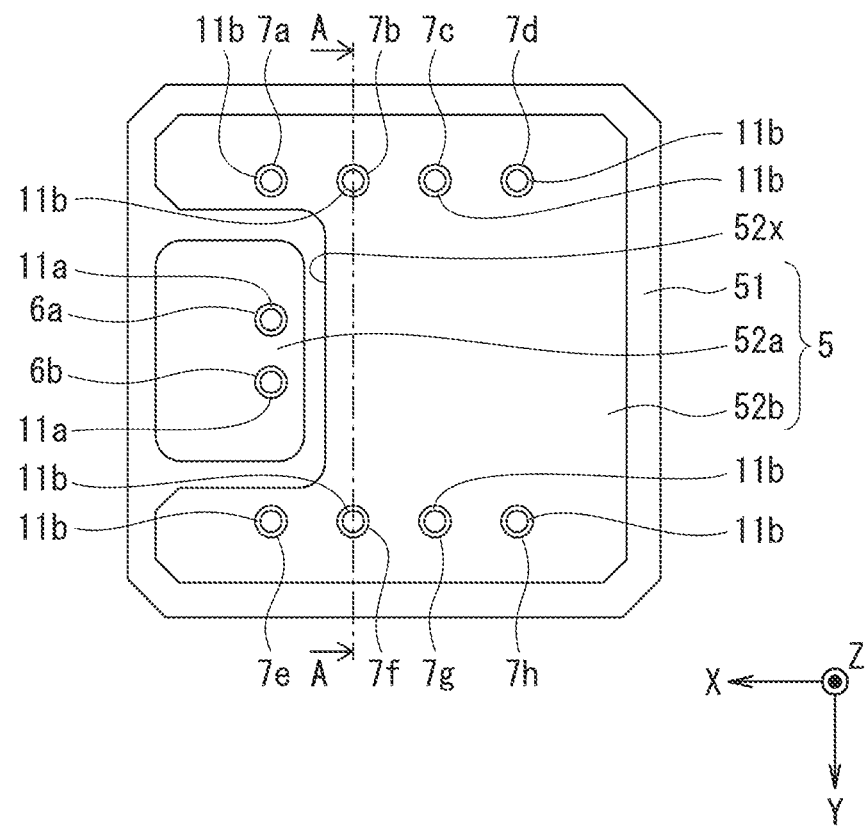
FIG. 10 is a plan view of the printed board of the semiconductor device according to the embodiment of the present invention.

FIG. 10 is a plan view as viewed from the other main surface (the non-element-opposed surface) of the printed board 5. As illustrated in FIG. 10, the common control electrode 52a and the second common main electrode 52b are separated from each other. The common control electrode 52a has a substantially rectangular planar pattern. The area of the common control electrode 52a in the planar pattern is smaller than the area of the control wiring part 53a in the planar pattern illustrated in FIG. 9. The common control electrode 52a is arranged to partly overlap with at least part of the control wiring part 53a illustrated in FIG. 9 with the insulating layer 51 interposed therebetween.

The second common main electrode 52b has a substantially rectangular planar pattern provided with a dent part (a recess) 52x. The common control electrode 52a is located in the dent part (the recess) 52x. The second common main electrode 52b is arranged to partly overlap with at least part of the main wiring part 53b with the insulating layer 51 interposed therebetween.

The respective planar patterns of the common control electrode 52a and the second common main electrode 52b are not limited to the cases illustrated in the drawings, and may be determined as appropriate depending on the arrangement positions of the control wiring part 53a and the main wiring part 53b. For example, the second common main electrode 52b may have a planar pattern without being provided with the dent part (the recess) 52x.

As illustrated in FIG. 9 and FIG. 10, the printed board 5 is provided with the first penetration holes 6a and 6b. The first penetration holes 6a and 6b are located at the positions different from the bonded positions between the control wiring part 53a and the respective projection electrodes 41a to 41d. The respective first penetration holes 6a and 6b are arranged at the positions at which the common control electrode 52a and the control wiring part 53a overlap with each other, and penetrate the control wiring part 53a, the insulating layer 51, and the common control electrode 52a. A first metal layer 11a such as a copper foil is provided on the inner circumferential surface (the inner wall) of the respective first penetration holes 6a and 6b by copper plating, for example. The first metal layer 11a electrically connects the common control electrode 52a and the control wiring part 53a of the printed board 5 to each other via the respective first penetration holes 6a and 6b. The common control electrode 52a and the control wiring part 53a are electrically connected to each other via the respective first penetration holes 6a and 6b to have the same potential. The common control electrode 52a is electrically connected to the control electrodes 31a to 31d of the semiconductor chips 3a to 3d via the first penetration holes 6a and 6b, the control wiring part 53a, and the projection electrodes 41a to 41d.

Figure 11:
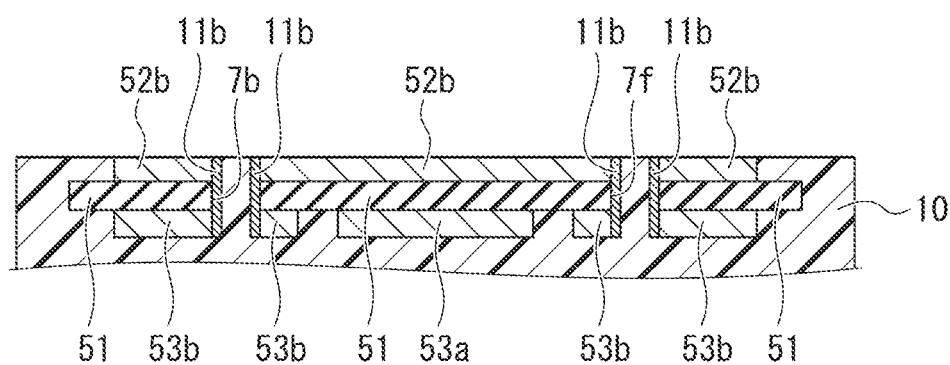
FIG. 11 is a cross-sectional view as viewed from direction A-A in FIG. 10.

As illustrated in FIG. 9 to FIG. 11, the printed board 5 is further provided with the second penetration holes 7a to 7h. The second penetration holes 7a to 7h are located at positions different from the bonded positions of the projection electrodes 42a to 42d and 43a to 43d. The respective second penetration holes 7a to 7h are arranged at the positions at which the second common main electrode 52b and the main wiring part 53b overlap with each other, and penetrate the main wiring part 53b, the insulating layer 51, and the second common main electrode 52b. A second metal layer 11b such as a copper foil is provided on the inner circumferential surface (the inner wall) of the respective second penetration holes 7a to 7h by copper plating, for example. The second metal layer 11b electrically connects the second common main electrode 52b and the main wiring part 53b of the printed board 5 to each other via the respective second penetration holes 7a to 7h. The second common main electrode 52b and the main wiring part 53b are electrically connected to each other via the respective second penetration holes 7a to 7h to have the same potential. The second common main electrode 52b is electrically connected to the second main electrodes 32a to 32d of the semiconductor chips 3a to 3d via the second penetration holes 7a to 7h, the main wiring part 53b, and the projection electrodes 42a to 42d and 43a to 43d.

As illustrated in FIG. 1 and FIG. 11, the respective first penetration holes 6a and 6b and the respective second penetration holes 7a to 7h are filled with the sealing member 10. The respective first penetration holes 6a and 6b and the respective second penetration holes 7a to 7h each have a size of about 200 micrometers, for example, but may be determined as appropriate. While FIG. 9 and FIG. 10 each illustrate the two first penetration holes 6a and 6b and the eight second penetration holes 7a to 7h, the number of the first penetration holes penetrating the control wiring part 53a, the insulating layer 51, and the common control electrode 52a and the number of the second penetration holes penetrating the main wiring part 53b, the insulating layer 51, and the second common main electrode 52b are not limited to the case illustrated in the drawings, and the arrangement positions of the respective penetration holes may be determined as appropriate.

As illustrated in FIG. 1, the common control electrode 52a and the second common main electrode 52b of the printed board 5 are exposed on the sealing member 10. The common control electrode 52a serves as an electrode pad common to the control electrodes 31a to 31d of the semiconductor chips 3a to 3d. The second common main electrode 52b serves as an electrode pad common to the second main electrodes 32a to 32d of the semiconductor chips 3a to 3d. The wire bonding or the ribbon bonding can be applied to each of the common control electrode 52a and the second common main electrode 52b.

The sealing member 10, the common control electrode 52a, and the second common main electrode 52b are on the same plane, which is the surface of the sealing member 10 on which the common control electrode 52a and the second common main electrode 52b are exposed. The common control electrode 52a and the second common main electrode 52b may project from the surface of the sealing member 10.

As illustrated in FIG. 1, FIG. 2, and FIG. 7, the sealing member 10 has a substantially cuboidal shape. The sealing member 10 is arranged so as to surround the circumference of the first common main electrode 1, the semiconductor chips 3a to 3d, and the printed board 5, and seals at least the semiconductor chips 3a to 3d. The other main surface (the non-element-mounted surface) of the first common main electrode 1, and the common control electrode 52a and the second common main electrode 52b on the other main surface (the non-element-opposed surface) of the printed board 5 are exposed on the sealing member 10.

As illustrated in FIG. 7 and FIG. 11, the sealing member 10 is caught on the edge parts of the insulating layer 51 of the printed board 5, so as to avoid the separation of the entire printed board 5. In addition, since the first penetration holes 6a and 6b and the second penetration holes 7a to 7h are filled with the sealing member 10, the bonding force is improved due to the anchoring effect, so as to prevent the partial separation of the printed board 5.

The sealing member 10 as used herein may be a resin material such as thermosetting resin that is hard and has high heat resistance, and specific examples include epoxy resin, maleimide resin, and cyanate resin. The material used for each of the sealing member 10, the semiconductor chips 3a to 3d, and the first common main electrode 1 is preferably chosen so that a mean coefficient of linear expansion of the sealing member 10 from a hardening temperature to a room temperature is set between a mean coefficient of linear expansion of the semiconductor material of the semiconductor chips 3a to 3d and a mean coefficient of linear expansion of the first common main electrode 1. This can avoid the separation of the semiconductor chips 3a to 3d and the first common main electrode 1.

<Method of Assembling Semiconductor Device>

An example of a method of assembling the semiconductor device according to the embodiment of the present invention is described below with reference to FIG. 5 and FIG. 6.

First, the respective first main electrodes 33a to 33d on one of the main surfaces (the non-element surface) of the semiconductor chips 3a to 3d are mounted and bonded to one of the main surfaces (the element-mounted surface) of the first common main electrode 1 via the respective bonding members 2a to 2d. The first common main electrode 1 and the respective semiconductor chips 3a to 3d are preferably bonded by a bonding method in which the fusing point of the bonding members 2a to 2d after bonding is 300° C. or greater.

Next, the respective projection electrodes 41a to 41d are positioned to be formed on the control electrodes 31a to 31d on the other main surface (the element surface) of the semiconductor chips 3a to 3d, and the respective projection electrodes 42a to 42d and 43a to 43d are positioned to be formed on the second main electrodes 32a to 32d on the other main surface (the element surface) of the semiconductor chips 3a to 3d. For example, when the projection electrodes 41a to 41d, 42a to 42d, and 43a to 43d are Au stud bumps, the respective projection electrodes are formed by use of Au wires by a wire bonder. The formation of the projection electrodes 41a to 41d, 42a to 42d, and 43a to 43d on the respective semiconductor chips 3a to 3d may be executed before the respective semiconductor chips 3a to 3d are mounted on the first common main electrode 1.

Next, the printed board 5 on one of the main surfaces (the element-opposed surface) is mounted on the other main surface (the element surface) of the respective semiconductor chips 3a to 3d via the projection electrodes 41a to 41d, 42a to 42d, and 43a to 43d. The projection electrodes 41a to 41d and the control wiring part 53a of the printed board 5 are bonded together, and the projection electrodes 42a to 42d and 43a to 43d and the main wiring part 53b of the printed board 5 are bonded together by ultrasonic bonding while applying pressure and heating as necessary.

Thereafter, a structure body including the first common main electrode 1, the respective semiconductor chips 3a to 3d, and the printed board 5 is placed in a metal die, and is molded with resin so as not to cause voids. The first penetration holes 6a and 6b and the second penetration holes 7a to 7h provided on the printed board 5 at this point are filled with the sealing member 10. The resin of each of the other main surface (the non-element-mounted surface) of the first common main electrode 1 and the other main surface (the non-element-opposed surface) of the second common main electrode 52b is polished by a laser or a mechanical polishing machine as necessary, so as to expose the other main surface (the non-element-mounted surface) of the first common main electrode 1 and the common control electrode 52a and the second common main electrode 52b of the printed board 5 on the sealing member 10. The semiconductor device according to the embodiment of the present invention is thus completed.

Application Example

Figure 12:
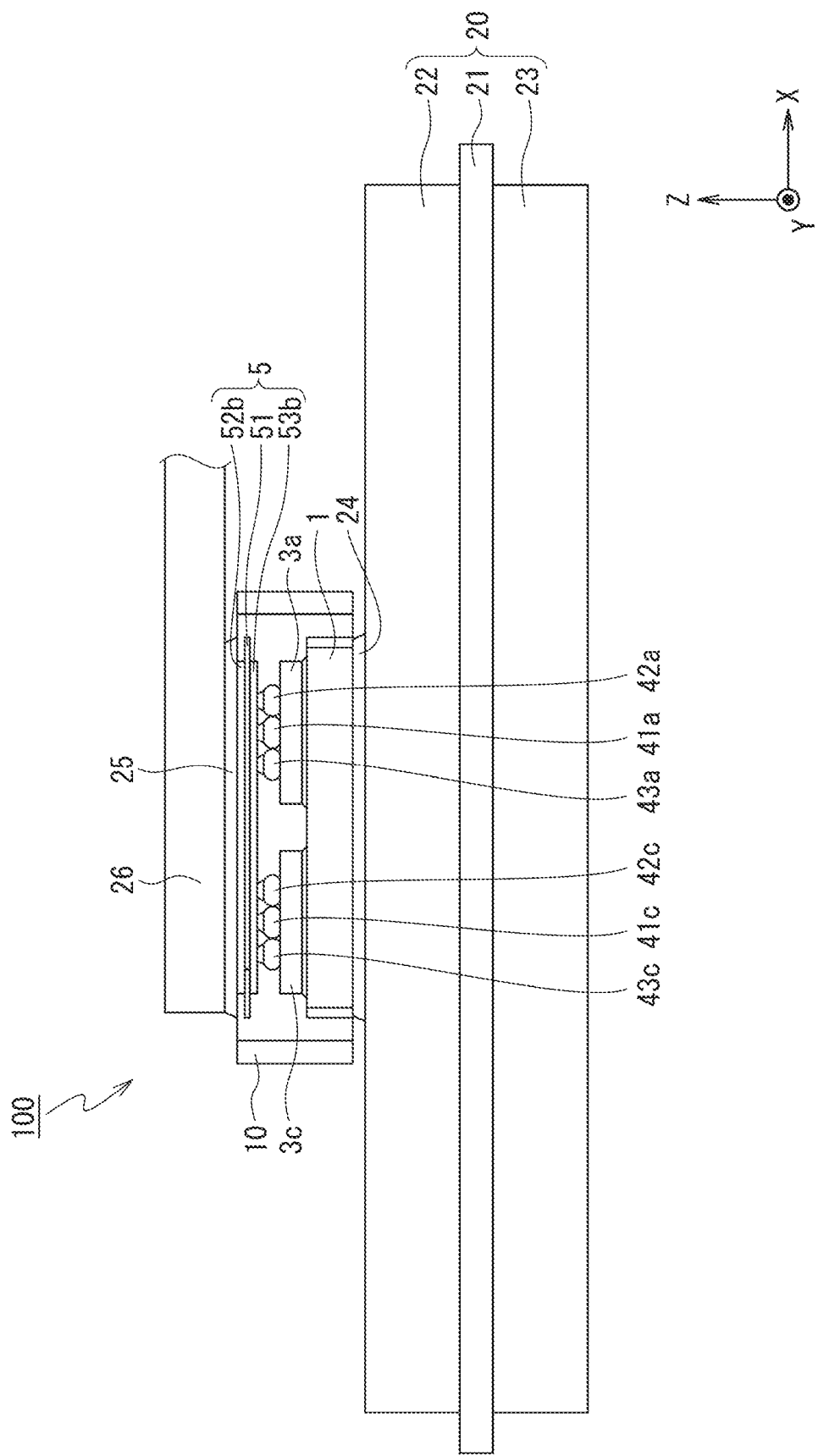
FIG. 12 is a side view illustrating an application example of the semiconductor device according to the embodiment of the present invention.

FIG. 12 illustrates an application example of the semiconductor device 100 according to the embodiment of the present invention. The first common main electrode 1 of the semiconductor device 100 according to the embodiment of the present invention is bonded to an insulating circuit substrate 20 via a bonding member 24. The second common main electrode 52b of the semiconductor device 100 according to the embodiment of the present invention is connected to a lead frame 26 via a bonding member 25. A plurality of semiconductor devices having a configuration similar to that of the semiconductor device 100 according to the embodiment of the present invention may be mounted on the insulating circuit substrate 20.

The insulating circuit substrate 20 may be a direct copper bonded (DCB) substrate or an active metal bonded (brazed) (AMB) substrate. The insulating circuit substrate 20 includes an insulating substrate 21, a wiring layer 22 deposited on one of the main surfaces of the insulating substrate 21, and a wiring layer 23 deposited on the other main surface of the insulating substrate 21. The insulating substrate 21 may be a ceramic substrate made of aluminum oxide ($Al_2O_3$), aluminum nitride (AlN), or silicon nitride ($Si_3N_4$), for example. A material used for the wiring layer 23 and the wiring layer 22 may each be a conductive foil such as copper (Cu) or aluminum (Al), for example.

The semiconductor device 100 according to the embodiment of the present invention combined with the lead frame 26 and the insulating circuit substrate 20 as illustrated in FIG. 12 may be collectively referred to as the semiconductor device according to the embodiment of the present invention.

COMPARATIVE EXAMPLES

Figure 13:
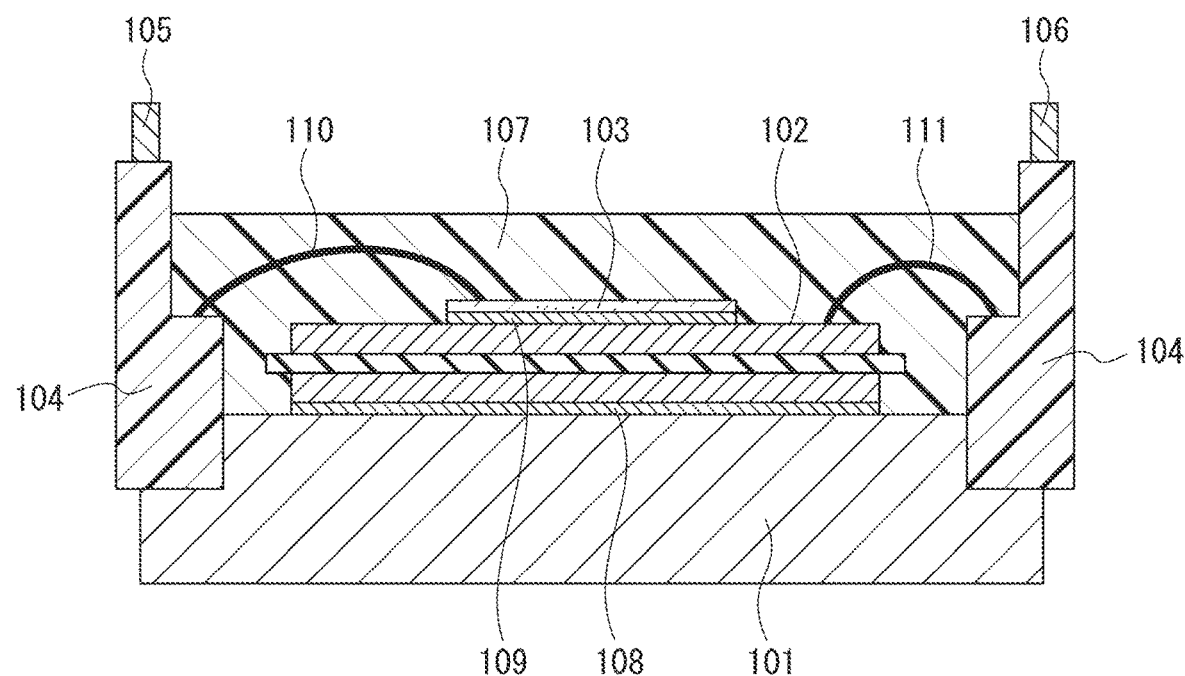
FIG. 13 is a cross-sectional view of a semiconductor device of a first comparative example.

Semiconductor devices of first and second comparative examples are described below. As illustrated in FIG. 13, the semiconductor device of the first comparative example includes one or more semiconductor chips 103 mounted on one of the main surfaces of an insulating circuit substrate 102 via a bonding member 108. The other main surface of the insulating circuit substrate 102 is mounted on a metal base 101 having a heat diffusing function. The circumference of the insulating circuit substrate 102 and the semiconductor chips 103 is covered with a resin case 104. The resin case 104 is filled with silicone gel 107 so as to improve the insulation property. The semiconductor chips 103 and the insulating circuit substrate 102 are electrically connected to external connection terminals 105 and 106 projecting from the resin case 104 via bonding wires 110 and 111 or bonding ribbons.

Figure 14:
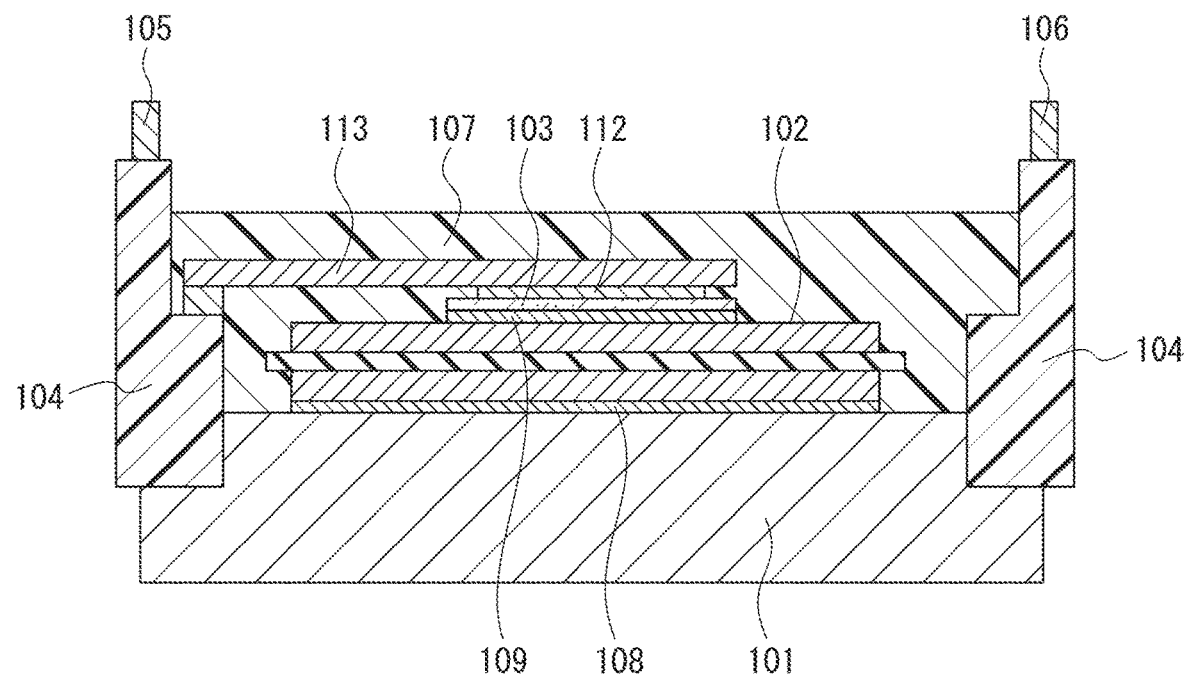
FIG. 14 is a cross-sectional view of a semiconductor device of a second comparative example.

As illustrated in FIG. 14, the semiconductor device of the second comparative example differs from the semiconductor device of the first comparative example illustrated in FIG. 13 in that the semiconductor chips 103 are connected to a lead frame 113 via a bonding member 112.

With regard to the semiconductor devices of the first and second comparative examples illustrated in FIG. 13 and FIG. 14, the semiconductor chips 103 have been combined on the semiconductor module manufacturer side to have necessary capacity and circuit structure to be connected by the wire bonding and the like, and the external connection terminals 105 and 106 have been led out to the outside. The user thus does not need to manage the fine semiconductor devices 103 themselves but only need to mechanically attach wires such as busbars to the external connection terminals 105 and 106. The semiconductor devices of the first and second comparative examples illustrated in FIG. 13 and FIG. 14 are, however, manufactured for various purposes, and each have a great volume with respect to the size of the semiconductor chips 103 themselves, which increases the length of the internal wires such as the bonding wires 110 and 111 accordingly.

Effects

In contrast, the semiconductor device according to the embodiment of the present invention enables the plural semiconductor chips 3a to 3d having the size as described above to be integrated together. Since the plural semiconductor chips, which have a small size and use the wide band-gap semiconductor such as SiC, GaN, and $Ga_2O_3$, can be arranged in parallel to be integrated together to increase the rating, so as to achieve a great reduction in cost to improve the yield, as compared with the case of manufacturing semiconductor chips having a larger size with the same rating.

In addition, the respective electrode pads of the first common main electrode 1, the common control electrode 52a, and the second common main electrode 52b have a larger size than the respective control electrodes 31a to 31d, the respective first main electrodes 33a to 33d, and the respective second main electrodes 32a to 32d of the semiconductor chips 3a to 3d. This allows various types of connection means appropriate for large current, such as thick bonding wires, bonding ribbons, or lead frames, to be applied to the semiconductor chips having a small size using the wide band-gap semiconductor. The configuration as described above thus can increase the flexibility of wiring and facilitate the management for normal users who assemble modules when using the semiconductor device according to the embodiment of the present invention.

In addition, the respective semiconductor chips 3a to 3d are molded at the circumference of the connected parts with the sealing member 10, so as to improve the mechanical reliability. For example, the semiconductor chips having a small size using the wide band-gap semiconductor have a small bonded area on the element surface, so as to reduce thermal stress at the bonded parts. The sealing member 10 thus can mechanically hold the bonded parts. The semiconductor chips 3a to 3d and the projection electrodes 41a to 41d, 42a to 42d, and 43a to 43d, which have a small size, hardly cause resin separation, or have a smaller influence on the element surface if separated. This can improve heat cycle tolerance and power cycle tolerance around the semiconductor chips 3a to 3d regardless of the case in which modules assembled by users employ gel sealing.

In addition, since the semiconductor chips 3a to 3d are arranged separately from the common control electrode 52a and the second common main electrode 52b serving as electrode pads, and are molded with the sealing member 10, the direct stress is hardly exerted on the semiconductor chips 3a to 3d when an external wire such as the lead frame 26 on the user's side is connected, as illustrated in FIG. 12.

In addition, the common control electrode 52a and the second common main electrode 52b are used as the electrode pads, instead of the control electrodes 31a to 31d and the second main electrodes 32a to 32d of the semiconductor chips 3a to 3d using the semiconductor having a low coefficient of linear expansion, so as to decrease a difference in the coefficient of linear expansion to avoid or reduce cracks caused at the connected parts upon a change in temperature when external metal wires are connected to these electrode pads. For example, when the wiring material on the user's side is the same material as the common control electrode 52a and the second common main electrode 52b (such as Cu), the thermal stress can be reduced to ensure a long life, as compared with the case of directly connecting the wires on the user's side to the control electrodes 31a to 31d and the second main electrodes 32a to 32d of the semiconductor chips 3a to 3d. This configuration thus can provide the semiconductor device at low costs while achieving a reduction in size, a small loss, and a long life.

In addition, the arrangement of the projection electrodes 41a to 41d, 42a to 42d, and 43a to 43d in the upright state on the semiconductor chips 3a to 3d when assembled facilitates the alignment between the semiconductor chips 3a to 3d and the printed board 5 with no requirement of high precision alignment. This configuration enables the management of the chips having a quite small size (electrode size), which cannot be handled by the conventional method as disclosed in WO 2014/061211.

In addition, the projection electrodes 41a to 41d, 42a to 42d, and 43a to 43d are bonded by ultrasonic bonding without the use of self-alignment used for welding by soldering. The use of the sintered metal body such as nanosilver (Ag) paste for the bonding members 2a to 2d for connecting the first common main electrode 1 and the semiconductor chips 3a to 3d thus can eliminate re-melting processing such as soldering, so as to deal with higher temperature. This can improve the reliability upon CSP bonding (packaging) and increase the temperature during use.

In addition, the first penetration holes 6a and 6b and the second penetration holes 7a to 7h provided on the printed board 5 are filled with the sealing member 10, so as to avoid the occurrence of the separation of the printed board 5 due to the anchor effect and the like. Further, the common control electrode 52a and the second common main electrode 52b as a circuit pattern of the printed board 5 can be used directly as external electrodes, so as to further reduce the thickness.

First Modified Example

Figure 15:
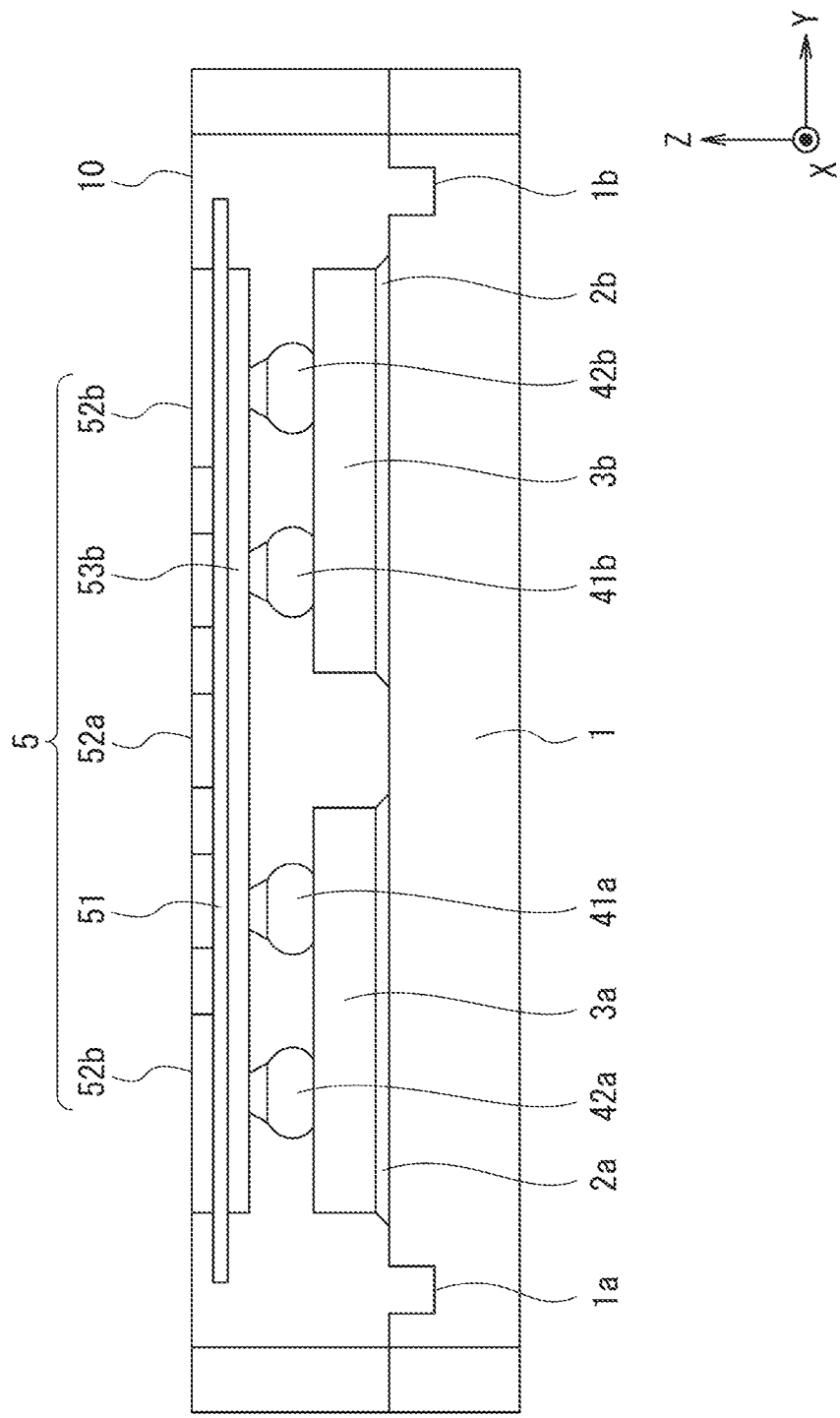
FIG. 15 is a side view of a semiconductor device according to a first modified example of the embodiment of the present invention.

A semiconductor device according to a first modified example of the embodiment of the present invention differs from the semiconductor device according to the embodiment of the present invention as illustrated in FIG. 7 in that the first common main electrode 1 is further elongated in the lateral direction (the Y-axis direction), and the side surface of the first common main electrode 1 is partly exposed to the outside of the sealing member 10, as illustrated in FIG. 15.

One of the main surfaces (the element-mounted surface) of the first common main electrode 1 is provided with grooves 1a and 1b. The grooves 1a and 1b are filled with the sealing member 10. The position, the shape, and the number of the grooves 1a and 1b are not limited to the case illustrated in FIG. 15, or the first common main electrode 1 is not necessarily provided with these grooves.

The semiconductor device according to the first modified example of the embodiment of the present invention, which has the configuration in which the side surface of the first common main electrode 1 is partly exposed to the outside of the sealing member 10, can increase the exposed area of the first common main electrode 1, so as to improve the heat releasing performance. In addition, the provision of the grooves 1a and 1b in the first common main electrode 1 can avoid the separation between the first common main electrode 1 and the sealing member 10.

Second Modified Example

Figure 16:
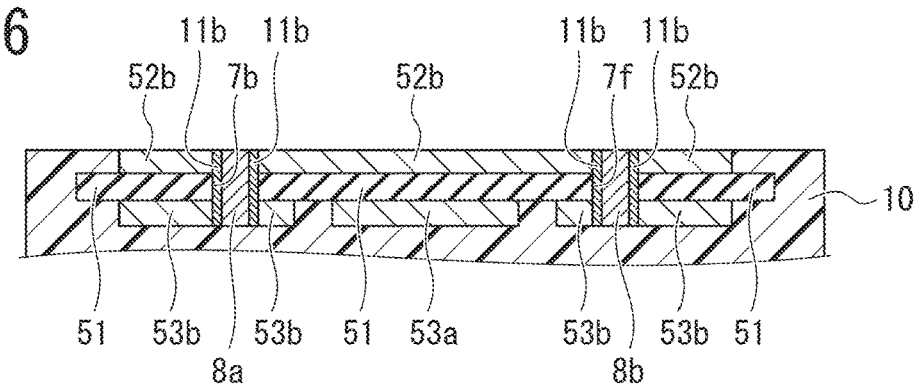
FIG. 16 is a cross-sectional view partly illustrating a semiconductor device according to a second modified example of the embodiment of the present invention.

A semiconductor device according to a second modified example of the embodiment of the present invention differs from the semiconductor device according to the embodiment of the present invention as illustrated in FIG. 11 in that the second penetration holes 7b and 7f are provided inside with conductive members 8a and 8b, as illustrated in FIG. 16.

The conductive members 8a and 8b may be pins made of metal such as Cu to be inserted to the second penetration holes 7b and 7f, for example. Although not illustrated, the first penetration holes 6a and 6b and the second penetration holes 7a, 7c to 7e, 7g, and 7h illustrated in FIG. 12 may also be provided inside with the conductive members.

The semiconductor device according to the second modified example of the embodiment of the present invention, which further includes the conductive members inserted in the first penetration holes 6a and 6b and the second penetration holes 7a to 7h, can improve the conductivity between the common control electrode 52a and the control wiring part 53a and between the second common main electrode 52b and the main wiring part 53b.

Third Modified Example

Figure 17:
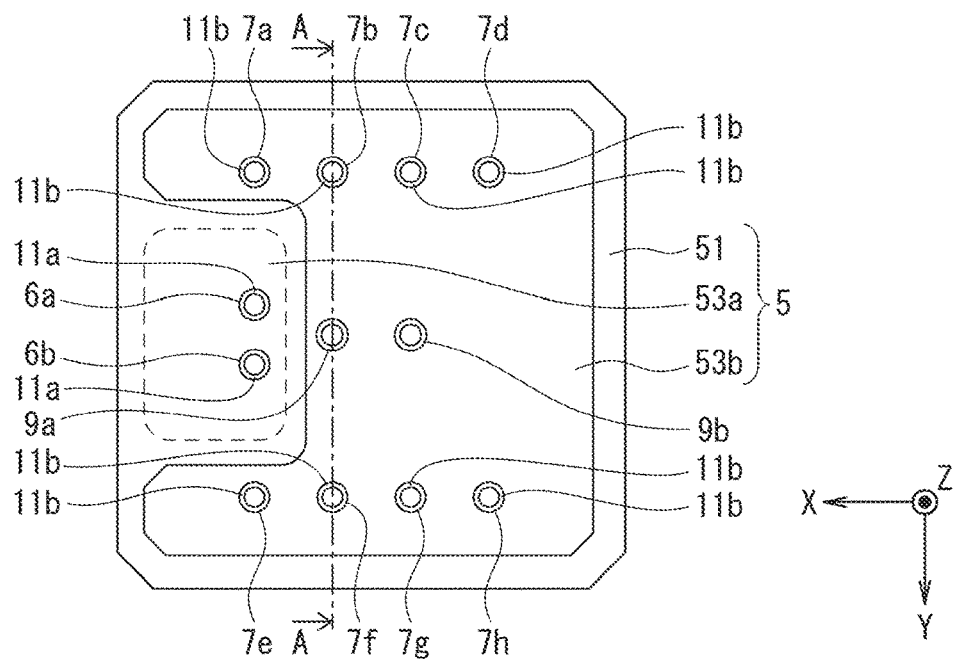
FIG. 17 is a plan view of a printed board of a semiconductor device according to a third modified example of the embodiment of the present invention.
Figure 18:
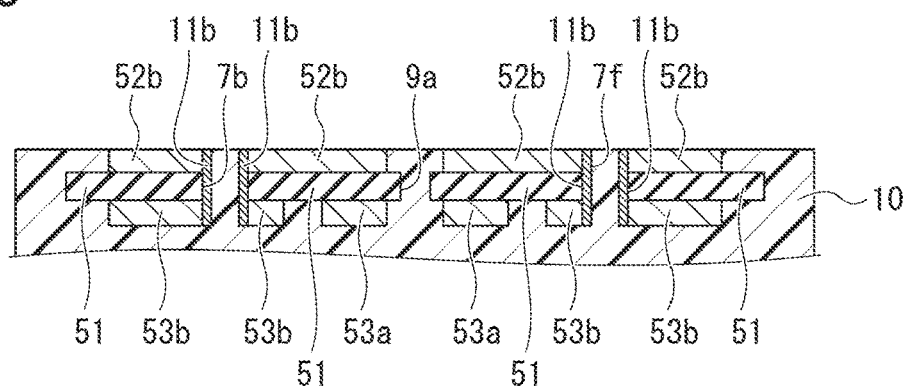
FIG. 18 is a cross-sectional view as viewed from direction A-A in FIG. 17.

A semiconductor device according to a third modified example of the embodiment of the present invention differs from the semiconductor device according to the embodiment of the present invention as illustrated in FIG. 10 in that the printed board 5 is provided with bonding-reinforcing penetration holes (non-through holes) 9a and 9b, as illustrated in FIG. 17 and FIG. 18.

The respective bonding-reinforcing penetration holes 9a and 9b are located at positions at which the control wiring part 53a and the second common main electrode 52b overlap with each other while interposing the insulating layer 51 therebetween. The respective bonding-reinforcing penetration holes 9a and 9b are filled with the sealing member 10. The inner circumferential surface of the respective bonding-reinforcing penetration holes 9a and 9b is not plated with copper. The respective bonding-reinforcing penetration holes 9a and 9b do not electrically connect the control wiring part 53a to the second common main electrode 52b. The area at the open part at which the respective bonding-reinforcing penetration holes 9a and 9b penetrate the control wiring part 53a and the second common main electrode 52b is larger than the area at the part at which the respective bonding-reinforcing penetration holes 9a and 9b penetrate the insulating layer 51.

The arrangement position and the number of the bonding-reinforcing penetration holes 9a and 9b may be determined as appropriate. For example, the respective bonding-reinforcing penetration holes 9a and 9b may be arranged at the position at which the control wiring part 53a and the common control electrode 52a overlap with each other while interposing the insulating layer 51 or at the position at which the main wiring part 53b and the second common main electrode 52b overlap with each other while interposing the insulating layer 51.

The semiconductor device according to the third modified example of the embodiment of the present invention, which further includes the bonding-reinforcing penetration holes 9a and 9b in the printed board 5 to be filled with the sealing member 10, and leads the sealing member 10 provided in the bonding-reinforcing penetration holes 9a and 9b to be caught on the insulating layer 51, can avoid the separation between the sealing member 10 and the printed board 5.

Other Embodiments

While the present invention has been illustrated by reference to the above embodiment, it should be understood that the present invention is not intended to be limited to the descriptions and the drawings composing part of this disclosure. It will be apparent to those skilled in the art that the present invention includes various alternative embodiments, examples, and technical applications according to the technical idea disclosed in the above embodiments.

For example, while the semiconductor device according to the embodiment of the present invention has been illustrated above with the case in which the semiconductor chips 3a to 3d are the elements having a vertical structure, the present invention can also be applied to a case in which the plural semiconductor chips are elements having a horizontal structure. The present invention can also be applied to a case in which the plural semiconductor chips are the elements having a horizontal structure and integrated together so as to be converted to a semiconductor device having a vertical structure, or a case in which the plural semiconductor chips are the element having a vertical structure and integrated together so as to be converted to a semiconductor device having a horizontal structure.

While the semiconductor device according to the embodiment of the present invention has been illustrated above with the case in which the projection electrodes 41a to 41d, 42a to 42d, and 43a to 43d are the stud bumps, the projection electrodes 41a to 41d, 42a to 42d, and 43a to 43d may be any bumps other than the stud bumps. Namely, the CSP configurations in which bumps are mechanically provided on semiconductor chips, and electrodes are collected and expanded by use of printed boards provided with penetration holes, are all within the scope of the present invention.

Various alternative embodiments, examples, and technical applications will be apparent to those skilled in the art according to the technical idea disclosed in the above embodiment. It should be understood that the present invention includes various embodiments not disclosed herein, such as a configuration to which the respective configurations as described in the above embodiment and the respective modified examples are optionally applied. Therefore, the technical scope of the present invention is defined only by the subject matter according to the claims reasonably derived from the foregoing descriptions.

What is claimed is:

1. A semiconductor device comprising:
    a plurality of semiconductor chips each including a first main electrode on one of main surfaces and including a second main electrode and a control electrode on another main surface;
    a first common main electrode with one of main surfaces connected to the respective first main electrodes of the semiconductor chips; and
    a printed board including an insulating layer with one of main surfaces separately opposed to the other main surface of the respective semiconductor chips, a control wiring part provided on the one main surface of the insulating layer to be electrically connected to the respective control electrodes, a main wiring part provided on the one main surface of the insulating layer and arranged adjacent to the control wiring part to be electrically connected to the respective second main electrodes, a common control electrode provided on another main surface of the insulating layer and located at a position at least partly overlapping with the control wiring part via the insulating layer in a plan view, a second common main electrode provided on the other main surface of the insulating layer and located at a position at least partly overlapping with the control wiring part and the main wiring part via the insulating layer in the plan view, a first metal layer provided on an inner wall of a first penetration hole penetrating the control wiring part, the insulating layer, and the common control electrode to electrically connect the control wiring part and the common control electrode via the first penetration hole, and a second metal layer provided on an inner wall of a second penetration hole penetrating the main wiring part, the insulating layer, and the second common main electrode to electrically connect the main wiring part and the second common main electrode via the second penetration hole.

2. The semiconductor device of claim 1, further comprising:
    a plurality of first projection electrodes arranged to bond the respective control electrodes of the semiconductor chips to the control wiring part;
    a plurality of second projection electrodes arranged to bond the respective second main electrodes of the semiconductor chips to the main wiring part; and
    a sealing member provided to seal the respective semiconductor chips such that another main surface of the first common main electrode, the common control electrode, and the second common main electrode are exposed on the sealing member.

3. The semiconductor device of claim 2, wherein the plural first projection electrodes and the plural second projection electrodes are each a stud bump.

4. The semiconductor device of claim 2, wherein the first penetration hole and the second penetration hole are filled with the sealing member.

5. The semiconductor device of claim 2, wherein a mean coefficient of linear expansion of the sealing member from a hardening temperature to a room temperature is set between a mean coefficient of linear expansion of a semiconductor material used for the respective semiconductor chips and a mean coefficient of linear expansion of the first common main electrode.

6. The semiconductor device of claim 2, wherein the printed board is provided with a bonding-reinforcing penetration hole filled with the sealing member.

7. The semiconductor device of claim 2, wherein the sealing member, the common control electrode exposed on the sealing member, and the second common main electrode exposed on the sealing member are in one plane.

8. The semiconductor device of claim 1, further comprising a conductive member provided in each of the first penetration hole and the second penetration hole.

9. The semiconductor device of claim 1, wherein a fusing point at a bonded part between the respective first main electrodes of the semiconductor chips and the first common main electrode is 300° C. or greater.

10. The semiconductor device of claim 1, wherein the semiconductor chips are arranged such that the respective control electrodes of the semiconductor chips are located adjacent to each other.

11. The semiconductor device of claim 1, wherein:
    the second common main electrode is provided with a dent part; and
    the common control electrode is located in the dent part.

* * * * *